United States Patent
Brandenburg et al.

(10) Patent No.: US 12,137,515 B2
(45) Date of Patent: Nov. 5, 2024

(54) ELECTROMAGNETIC INTERFERENCE SHIELDING AND THERMAL MANAGEMENT SYSTEMS AND METHODS FOR AUTOMOTIVE RADAR APPLICATIONS

(71) Applicant: APTIV TECHNOLOGIES LIMITED, St. Michael (BB)

(72) Inventors: Scott D. Brandenburg, Kokomo, IN (US); David W. Zimmerman, Noblesville, IN (US); Navneet Gupta, Bangalore (IN)

(73) Assignee: APTIV TECHNOLOGIES AG, Schaffhausen (CH)

( * ) Notice: Subject to any disclaimer, the term of this patent is extended or adjusted under 35 U.S.C. 154(b) by 776 days.

(21) Appl. No.: 17/217,511

(22) Filed: Mar. 30, 2021

(65) Prior Publication Data

US 2022/0248525 A1    Aug. 4, 2022

(51) Int. Cl.
*H05K 1/02* (2006.01)
*G01S 7/02* (2006.01)
*G01S 13/931* (2020.01)
*H01L 23/367* (2006.01)
*H01L 23/552* (2006.01)
(Continued)

(52) U.S. Cl.
CPC ............ *H05K 1/0204* (2013.01); *G01S 7/023* (2013.01); *G01S 7/028* (2021.05); *G01S 13/931* (2013.01); *H01L 23/3675* (2013.01); *H01L 23/552* (2013.01); *H05K 1/181* (2013.01); *H05K 1/182* (2013.01); *H05K 3/306* (2013.01); *H05K 7/205* (2013.01); *H05K 9/0049* (2013.01);
(Continued)

(58) Field of Classification Search
CPC ...... H05K 1/0204; H05K 1/181; H05K 1/182; H05K 3/306; H05K 7/205; H05K 9/0049; H05K 2201/10303; G01S 7/028; G01S 7/023; G01S 13/931; G01S 2013/93271; H01L 23/3675; H01L 23/552
See application file for complete search history.

(56) References Cited

U.S. PATENT DOCUMENTS 7,262,369 B1 * 8/2007 English ................... H01L 23/04
174/370
7,361,985 B2    4/2008 Yuan et al.
(Continued)

FOREIGN PATENT DOCUMENTS

CN        111867344 A  * 10/2020  ............. G01S 13/06
DE   102011084108 A1  *  4/2013  ........... H01R 12/724
(Continued)

*Primary Examiner* — Vladimir Magloire
*Assistant Examiner* — Maxine McKenzie Phillips
(74) *Attorney, Agent, or Firm* — Miller Johnson

(57) ABSTRACT

An electromagnetic interference (EMI) shielding and thermal management system, method, and automotive radar system for an integrated circuit of a product circuit board (PCB) of a radar sensor includes a shield member disposed above the integrated circuit and extending to unpopulated areas of the PCB and configured to shield the integrated circuit from EMI and transfer heat energy generated by the integrated circuit away from the integrated circuit, and a set of pin members configured to be inserted through respective apertures defined by the shield member and the PCB and configured to transfer the heat energy from the shield member to an environment external to the PCB.

20 Claims, 3 Drawing Sheets

(51) Int. Cl.
  *H05K 1/18*   (2006.01)
  *H05K 3/30*   (2006.01)
  *H05K 7/20*   (2006.01)
  *H05K 9/00*   (2006.01)

(52) U.S. Cl.
  CPC .............. *G01S 2013/93271* (2020.01); *H05K 2201/10303* (2013.01)

(56) References Cited

U.S. PATENT DOCUMENTS

| | | |
|---|---|---|
| 7,498,907 B2 | 3/2009 | Suzuki et al. |
| 8,537,552 B2 | 9/2013 | Paquette et al. |
| 2020/0350670 A1 * | 11/2020 | Beer ........................ G01S 7/027 |

FOREIGN PATENT DOCUMENTS

| | | | |
|---|---|---|---|
| EP | 3232222 A1 * | 10/2017 | ........... G01S 13/931 |
| KR | 1022971 B1 * | 3/2011 | |
| WO | WO-2021007667 A1 * | 1/2021 | ............. E05B 81/77 |

* cited by examiner

ELECTROMAGNETIC INTERFERENCE SHIELDING AND THERMAL MANAGEMENT SYSTEMS AND METHODS FOR AUTOMOTIVE RADAR APPLICATIONS

CROSS-REFERENCE TO RELATED APPLICATIONS

This application claims priority to Indian Patent Application No. 202141004260 filed on Feb. 1, 2021, the entire disclosure of which is incorporated herein by reference.

FIELD

The present disclosure generally relates to automotive radar sensor systems and, more particularly, to electromagnetic interference (EMI) shielding and thermal management systems and methods for automotive radar applications.

BACKGROUND

There are many electronic packaging challenges for automotive radar sensors. Electromagnetic interference (EMI) and thermal management are two examples of such challenges. In order to protect electronic components (processors, circuits, etc.) from EMI, these components must be shielded. Thermal energy generated by these and other devices must also be removed to prevent over-temperature conditions that could potentially cause damage. One conventional solution to the thermal management problem is traditional thru-board heat sinking. When the electronic components are mounted on a radome/outer side of a circuit board (e.g., a product circuit board, or PCB), this traditional thru-board heat sinking may not be possible due to the presence of discrete components on the opposing/under side of the circuit board. Thus, while these conventional solutions can sometimes work for their intended purpose, there exists an opportunity for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, an electromagnetic interference (EMI) shielding and thermal management system for an integrated circuit of a product circuit board (PCB) of a radar sensor is presented. In one exemplary implementation, the system comprises a shield member disposed above the integrated circuit and extending to unpopulated areas of the PCB and configured to shield the integrated circuit from EMI and transfer heat energy generated by the integrated circuit away from the integrated circuit, and a set of pin members configured to be inserted through respective apertures defined by the shield member and the PCB, and configured to transfer the heat energy from the shield member to an environment external to the PCB.

In some implementations, the shield member is formed of a stamped metal. In some implementations, the shield member is formed of a graphite pad or sheet. In some implementations, the integrated circuit is a monolithic microwave integrated circuit (MMIC) and the radar sensor is an automotive radar sensor for a vehicle. In some implementations, the vehicle comprises a radome that protects the radar sensor from an environment external to the vehicle, and wherein the integrated circuit is mounted on a side of the PCB closer to the radome. In some implementations, the unpopulated area of the PCB excludes antenna areas. In some implementations, the set of pin members are oversized relative to the apertures defined by the shield member such that the set of pin members are each forcibly inserted through the respective apertures defined by the shield member to create an air-tight thermal connection therethrough. In some implementations, the environment external to the PCB includes a thermally conductive plastic member disposed on an opposing side of the PCB. In some implementations, the environment external to the PCB includes an aluminum case on an opposing side of the PCB.

According to another aspect of the present disclosure, a method of EMI shielding and thermal management for an integrated circuit of a PCB of a radar sensor is presented. In one exemplary implementation, the method comprises providing a shield member disposed above the integrated circuit and extending to unpopulated areas of the PCB and configured to shield the integrated circuit from EMI and transfer heat energy generated by the integrated circuit away from the integrated circuit, and providing a set of pin members configured to be inserted through respective apertures defined by the shield member and the PCB and configured to transfer the heat energy from the shield member to an environment external to the PCB.

In some implementations, the method further comprises forming the shield member from a stamped metal. In some implementations, the method further comprises forming the shield member from a graphite pad or sheet. In some implementations, the integrated circuit is a MMIC and the radar sensor is an automotive radar sensor for a vehicle. In some implementations, the vehicle comprises a radome that protects the radar sensor from an environment external to the vehicle, and wherein the integrated circuit is mounted on a side of the PCB closer to the radome. In some implementations, the unpopulated area of the PCB excludes antenna areas. In some implementations, the set of pin members are oversized relative to the apertures defined by the shield member. In some implementations, the method further comprises forcibly inserting the set of pin members through the respective apertures defined by the shield member to create an air- tight thermal connection therethrough. In some implementations, the environment external to the PCB includes a thermally conductive plastic member disposed on an opposing side of the PCB. In some implementations, the environment external to the PCB includes an aluminum case on an opposing side of the PCB.

According to yet another aspect of the present disclosure, an automotive radar sensor system for a vehicle is presented. In one exemplary implementation, the automotive radar sensor system comprises a radar sensor, a radome disposed proximate to a first side of the radar sensor and configured to protect the radar sensor from an environment external to the vehicle, wherein the radar sensor comprises a PCB having a monolithic microwave integrated circuit disposed thereon on a side closest to the radome, and an EMI shielding and thermal management system for the radar sensor, the system comprising a shield member disposed between the integrated circuit and the radome and extending to unpopulated areas of the PCB excluding antenna areas, and being configured to shield the integrated circuit from EMI and transfer heat energy generated by the integrated circuit away from the integrated circuit, and a set of pin members configured to be inserted through respective apertures defined by the shield member and the PCB and configured to transfer the heat energy from the shield member to an environment external to the PCB.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

As previously discussed, there exists an opportunity for improvement in the art of electromagnetic interference (EMI) shielding and thermal management for automotive radar sensors, particularly for an integrated circuit disposed on a product circuit board (PCB) of the radar sensor on a side closest to a radome associated with the radar sensor. Accordingly, improved EMI shielding and thermal management systems and methods for radar sensors are presented. While specifically described with respect to automotive applications, it will be appreciated that the disclosed systems and methods could be applicable to any suitable radar sensor systems. A shield member is disposed between an integrated circuit of a PCB and a radome and extending to unpopulated areas of the PCB. The term "unpopulated areas" in describing the PCB refers to portions of the PCB where there are no components and apertures can be formed and heat transfer can occur. Thus, the unpopulated areas of the PCB should also explicitly exclude antenna areas of the PCB. The shield member is configured to shield the integrated circuit from EMI and transfer heat energy generated by the integrated circuit away from the integrated circuit. A set of pin members are inserted through respective apertures defined by the shield member and the PCB and are configured to transfer the heat energy from the shield member to an environment external to the PCB. In one exemplary implementation, the integrated circuit is a monolithic microwave integrated circuit (MMIC) designed specifically for radar sensing applications.

Figure 1:
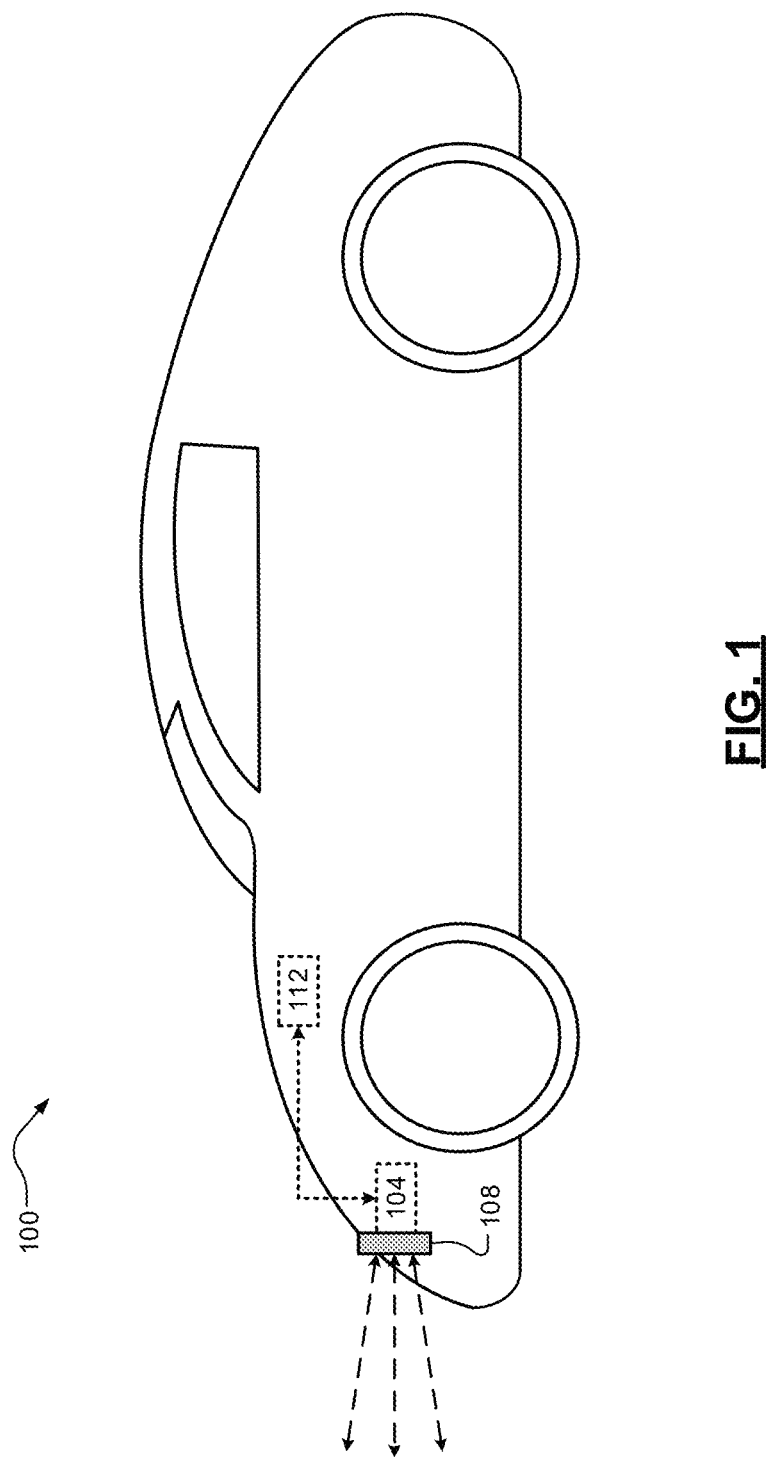
FIG. 1 illustrates a side or cross-sectional view of a vehicle having an example automotive radar sensor system according to some implementations of the present disclosure.

Referring now to FIG. 1, a side or cross-sectional view of a vehicle 100 having an example automotive radar sensor system 104 according to some implementations of the present disclosure is illustrated. The radar sensor system 104 is disposed behind a radome 108 that protects the radar sensor system 104 from an environment external to the vehicle 100. This can include, for example, protecting the radar sensor system 104 from physical debris and water/snow/ice. The radar sensor system 104 transmits radar waves through the radome 108, which are then reflected by nearby objects back towards the radar sensor system 104 and the received reflected radar waves are processed (e.g., by the radar sensor system 104 itself and/or by a separate vehicle controller 112) to determine the proximity/locations of the nearby objects. The radome 108 could be, for example, external to the vehicle 100 (e.g., a standalone emblem) or partially or fully integrated into the vehicle 100 (e.g., in a grille or bumper assembly). It will be appreciated that the location of the radar sensor system 104 (i.e., central, front-facing) is merely one example and that the radar sensor system 104 could be implemented at any suitable location in the vehicle 100 and/or it will be appreciated that there could be multiple radar sensor systems 104 implemented at different locations in the vehicle 100. Date gathered by multiple radar sensor systems 104, for example, could be particularly useful by advanced driver assistance (ADAS) and/or autonomous driving features of the vehicle 100.

Figure 2A:
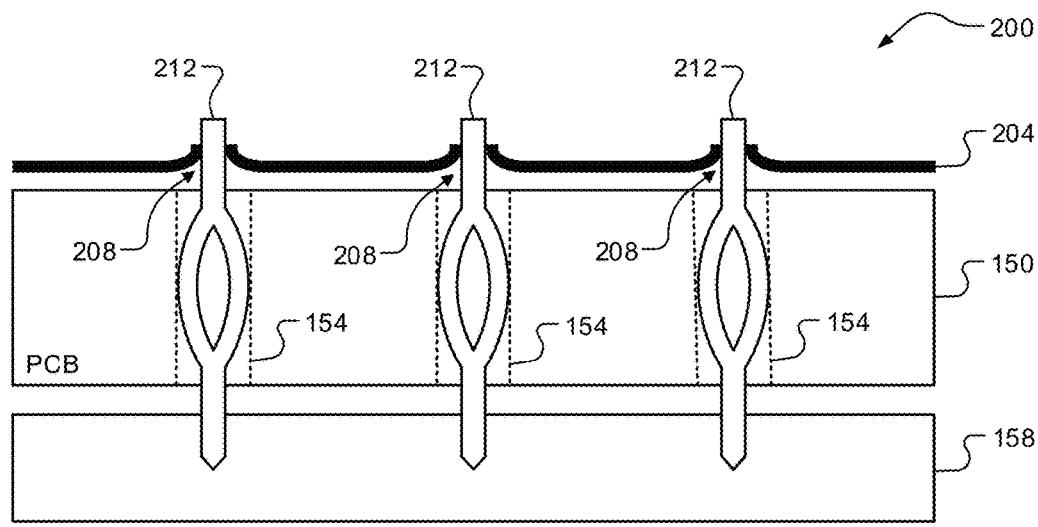
FIG. 2A-2B illustrate side or cross-sectional views of an example electromagnetic interference (EMI) shielding and thermal management system for a radar sensor according to some implementations of the present disclosure.
Figure 2B:
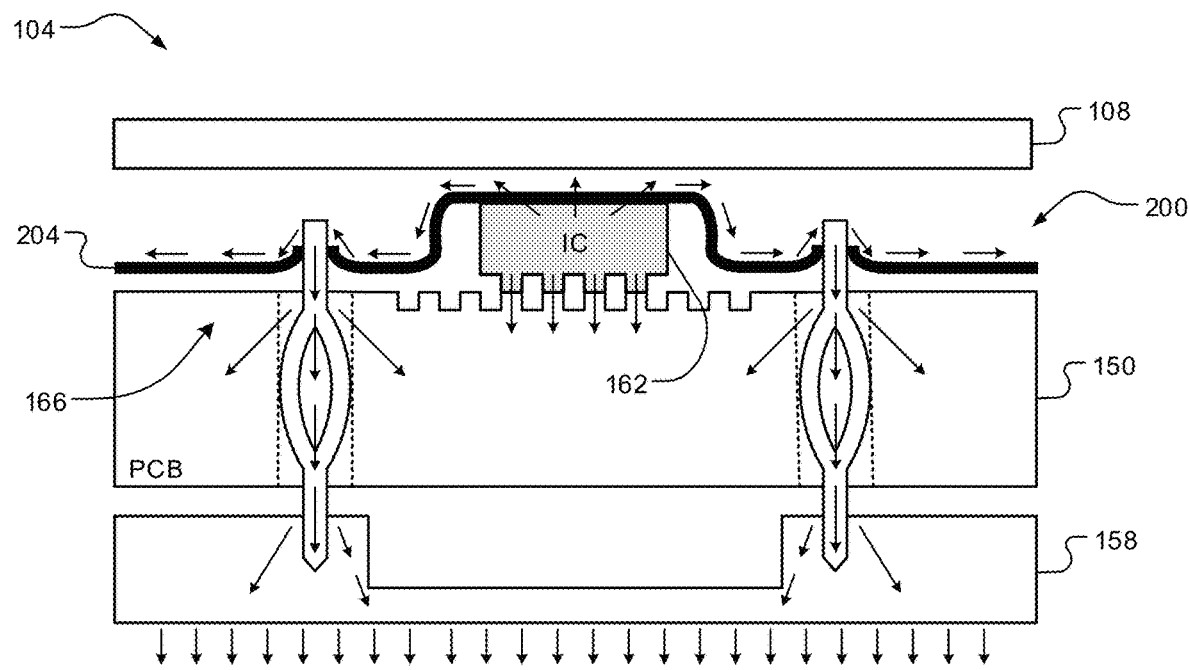

Referring now to FIGS. 2A-2B, side or cross-sectional views of an example EMI shielding and thermal management system 200 for a radar sensor according to some implementations of the present disclosure are illustrated. For purposes of this description, the radar sensor system 104 and its components will be shown and described, but it will be appreciated that the EMI shielding and thermal management system 200 could be applicable to any suitable radar sensor. The radar sensor system 104 further comprises a PCB 150 defining a plurality of apertures 154 therethrough and an external environment 158 on one of its sides. This external environment 158 could be air or could be a member coupled to or spaced from the side of the PCB 158 as shown. In one exemplary implementation, the external environment 158 includes a thermally conductive plastic member. In another exemplary implementation, the external environment 158 includes an aluminum case for the PCB 150 or the entire radar sensor system 104. The radar sensor system 104 further comprises an integrated circuit (IC) 162 electrically connected in any suitable manner to an opposing side of the PCB 150 closer to the radome 108. In one exemplary implementation, the integrated circuit 162 is an MMIC specifically designed for automotive radar applications. Such devices, for example, may be prone to generating relatively large amounts of heat compared to other integrated circuits. As shown, the apertures 154 through the PCB 150 are located at unpopulated areas 166 of the PCB 150 (e.g., away from the integrated circuit 154 and other components on either side of the PCB 150. These unpopulated areas 166 should also exclude antenna areas (e.g., antenna array portions) of the radar sensor system 104.

The EMI shielding and thermal management system 200 according to some implementations of the present disclosure is also illustrated. The system 200 generally comprises a shield member:204 disposed above the integrated circuit 162 or rather between the integrated circuit 162 and the radome 108. In one exemplary implementation as shown, the shield member 204 physically contacts the integrated circuit 162 to provide for maximum heat transfer therefrom, but it will be appreciated that there could be air or other dielectric or another conductor therebetween. The shield member 204 extends to the unpopulated areas 166 of the PCB 150 and is configured to shield the integrated circuit 162 from EMI from other electrical devices/systems of the vehicle 100 and to transfer heat energy generated by the integrated circuit 162 away from the integrated circuit 162 as shown in FIG. 2B. The shield member 204 also defines a respective plurality of apertures 208 corresponding to the plurality of apertures 154 of the PCB 150 but having a lesser size/ diameter. In one exemplary implementation, the shield member 204 is formed of a stamped metal (e.g., aluminum). In another exemplary implementation, the shield member 204 is formed of a graphite pad or sheet. It will be appreciated, however, that the shield member 204 could be formed of any suitable electrically conductive material that provides EMI shielding and that meets any other design objectives (lightweight, durable, etc.).

The system 200 further comprises a set of pin members 212 configured to be inserted through respective apertures 208, 154 defined by the shield member 204 and the PCB 150. The term "pin member" as used herein can also be described as a "compliant pin" or "compliant pin member" as each pin member 212 can be designed via compliant pin technology to provide a press-fit, solder free connection (e.g., spring-like) of devices to a PCB 150 (e.g., via plated-through apertures or holes). As previously mentioned and as illustrated, the set of pin members 212 are oversized relative to the apertures 208 defined by the shield member 204 such that the set of pin members are each forcibly inserted through the respective apertures 208 defined by the shield member 204 to create an air-tight thermal connection therewith. The set of pin members 212, when properly installed, are configured to fix the shield member 204 relative to the PCB 150 and to transfer the heat energy from the shield member 204 to the external environment 158 as shown in FIG. 2B. Some heat energy will still dissipate or transfer via the PCB 150, but the majority of the heat energy should be drawn away from the integrated circuit 162 before it begins to transfer to the opposing side of the PCB 150. By drawing heat energy away from the integrated circuit 162 and other components of the PCB 150, potential damage due to excessive heat energy (e.g., to damage silicon junctions of the integrated circuit 162 or other componentry) can be avoided while also providing for improved heat dissipation to the external environment 158.

Figure 3:
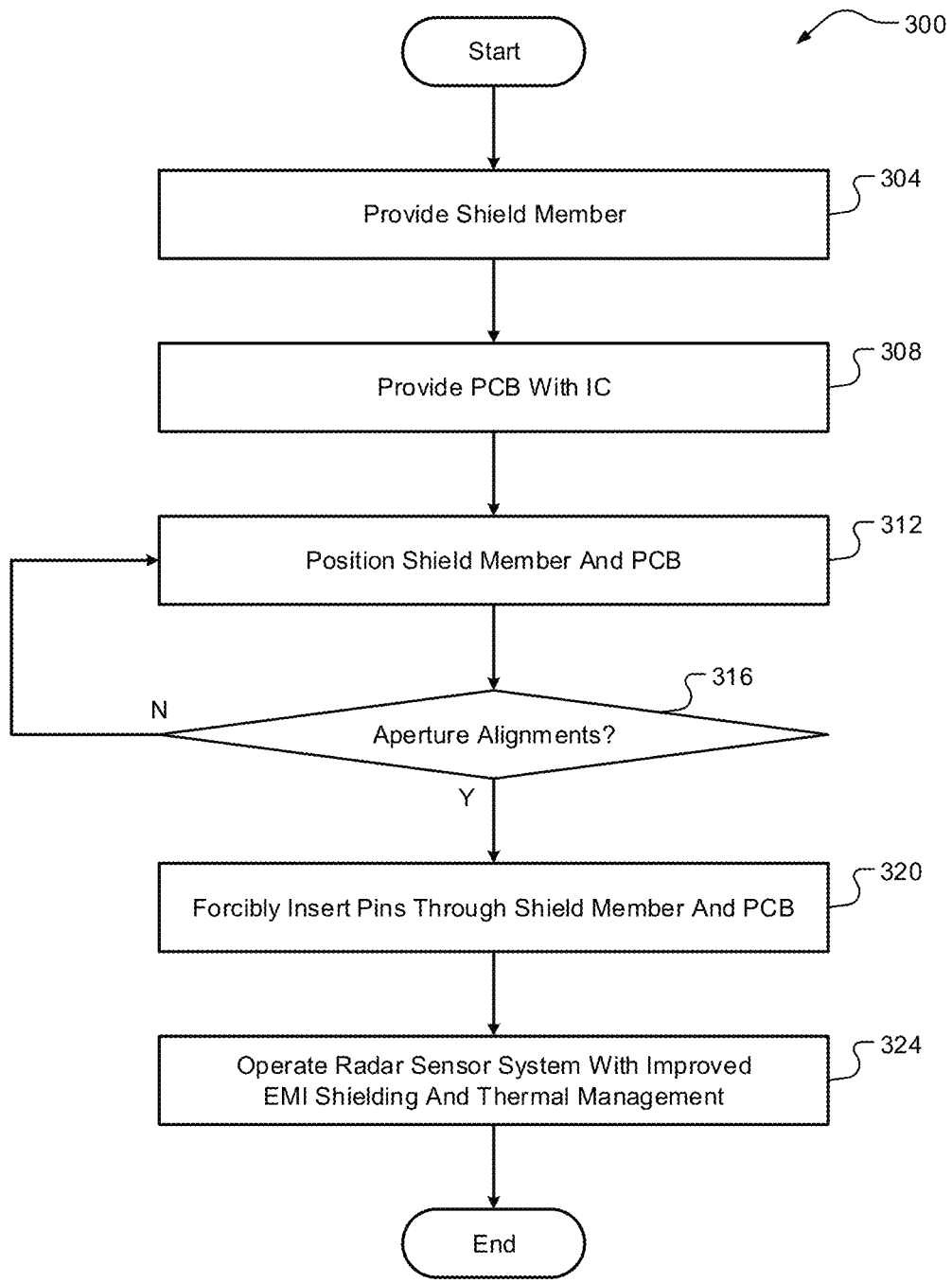
FIG. 3 illustrates a flow diagram of an example EMI shielding and thermal management method for a radar sensor according to some implementations of the present disclosure.

Referring now to FIG. 3, a flow diagram of an example EMI shielding and thermal management method 300 for a radar sensor according to some implementations of the present disclosure is illustrated. Again, for purposes of this description, the radar sensor system 104 and its components will be described/referenced, but it will be appreciated that the EMI shielding and thermal management method 300 could be applicable to any suitable radar sensor. At 304, the shield member 204 is provided. This step could include forming the shield member 204 (stamped metal, graphite pad/sheet, etc.) and its apertures 208. At 308, the PCB 150 having the integrated circuit (IC) 162 electrically connected thereto is provided. At 312, the shield member 204 is positioned relative to the PCB 150 in an attempt to align their respective pluralities of apertures 208. At 316, it is determined whether the pluralities of apertures 208, 154 are substantially aligned. When false, positioning continues at 312 until substantial alignment is achieved. When true, the method 300 proceeds to 320 where the set of pin members 212 are forcibly inserted through the plurality of apertures 208 of the shield member 204 and the respective plurality of apertures 154 of the PCB 150 thereby fixing the shield member 204 relative to the PCB 150 and providing or completing an improved thermal transfer pathway to the external environment 158. At optional 324, the radar sensor system 104 is then operated with improved EMI shielding and thermal transfer/management. The method 300 then ends.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) shielding and thermal management system for a radar sensor, the system comprising:
   a product circuit board (PCB) defining a first aperture defining a first diameter;
   an integrated circuit coupled to the PCB;
   a shield member directly engaging the integrated circuit and extending to unpopulated areas of the PCB, the shield member defining a second aperture defining a second diameter less than the first diameter, the shield member configured to shield the integrated circuit from EMI and transfer heat energy generated by the integrated circuit away from the integrated circuit; and
   a pin member including a first portion defining a first cross-sectional dimension and a second portion defining a second cross-sectional dimension less than the first cross-sectional dimension, the first portion disposed within the first aperture, the second portion disposed within the second aperture, the pin member configured to transfer the heat energy from the shield member to an environment external to the PCB.

2. The system of claim 1, wherein the shield member is formed of a stamped metal.

3. The system of claim 1, wherein the shield member is formed of a graphite pad or sheet.

4. The system of claim 1, wherein the integrated circuit is a monolithic microwave integrated circuit (MMIC) and the radar sensor is an automotive radar sensor for a vehicle.

5. The system of claim 4, wherein the vehicle includes a radome that protects the radar sensor from an environment external to the vehicle, and wherein the integrated circuit is mounted on a side of the PCB closer to the radome.

6. The system of claim 5, wherein the unpopulated areas of the PCB exclude antenna areas.

7. The system of claim 1, wherein the second portion of the pin member is oversized relative to the second aperture defined by the shield member such that the second portion of the pin member is forcibly inserted through the second aperture defined by the shield member to create an air-tight thermal connection therethrough.

8. The system of claim 7, wherein the environment external to the PCB includes a thermally conductive plastic member disposed on an opposing side of the PCB.

9. The system of claim 7, wherein the environment external to the PCB includes an aluminum case on an opposing side of the PCB.

10. The system of claim 1, wherein:
the pin member includes a third portion defining a third cross-sectional dimension;
the third cross-sectional dimension is identical to the second cross-sectional dimension;
the first portion is disposed between the second portion and the third portion;
the third portion is disposed within the environment; and
the first portion is configured to operate as a spring to connect the pin member with the PCB.

11. A method of electromagnetic interference (EMI) shielding and thermal management for a radar sensor, the method comprising:
providing a product circuit board (PCB) defining a first aperture defining a first diameter;
providing an integrated circuit coupled to the PCB;
providing a shield member:
  directly engaging the integrated circuit and extending to unpopulated areas of the PCB;
  defining a second aperture defining a second diameter less than the first diameter; and
  configured to shield the integrated circuit from EMI and transfer heat energy generated by the integrated circuit away from the integrated circuit;
providing a pin member:
  including a first portion defining a first cross-sectional dimension;
  including a second portion defining a second cross-sectional dimension less than the first cross-sectional dimension; and
  configured to transfer the heat energy from the shield member to an environment external to the PCB; and
inserting the first portion into the first aperture and the second portion into the second aperture.

12. The method of claim 11, further comprising forming the shield member from one of a stamped metal, a graphite pad, or a graphite sheet.

13. The method of claim 11, wherein the integrated circuit is a monolithic microwave integrated circuit (MMIC) and the radar sensor is an automotive radar sensor for a vehicle.

14. The method of claim 13, wherein the vehicle includes a radome that protects the radar sensor from an environment external to the vehicle, and wherein the integrated circuit is mounted on a side of the PCB closer to the radome.

15. The method of claim 14, wherein the unpopulated areas of the PCB exclude antenna areas.

16. The method of claim 15, wherein the second portion of the pin member is oversized relative to the second aperture defined by the shield member.

17. The method of claim 16, further comprising forcibly inserting the second portion of the pin member through the second aperture defined by the shield member to create an air-tight thermal connection therethrough.

18. The method of claim 17, wherein the environment external to the PCB includes a thermally conductive plastic member disposed on an opposing side of the PCB.

19. The method of claim 17, wherein the environment external to the PCB includes an aluminum case on an opposing side of the PCB.

20. An automotive radar sensor system for a vehicle, the automotive radar sensor system comprising:
a radar sensor;
a radome disposed proximate to a first side of the radar sensor and configured to protect the radar sensor from an environment external to the vehicle, wherein the radar sensor includes a product circuit board (PCB) having:
  a first aperture defining a first diameter; and
  a monolithic microwave integrated circuit disposed thereon on a side closest to the radome; and
an electromagnetic interference (EMI) shielding and thermal management system for the radar sensor, the system comprising:
  a shield member:
    directly engaging the integrated circuit;
    disposed between the integrated circuit and the radome and extending to unpopulated areas of the PCB excluding antenna areas;
    defining a second aperture defining a second diameter less than the first diameter; and
    being configured to shield the integrated circuit from EMI and transfer heat energy generated by the integrated circuit away from the integrated circuit; and
  a pin member:
    including a first portion defining a first cross-sectional dimension and a second portion defining a second cross-sectional dimension less than the first cross-sectional dimension, the first portion disposed within the first aperture, the second portion disposed within the second aperture; and
    configured to transfer the heat energy from the shield member to an environment external to the PCB.

* * * * *

UNITED STATES PATENT AND TRADEMARK OFFICE
CERTIFICATE OF CORRECTION

PATENT NO. : 12,137,515 B2  
APPLICATION NO. : 17/217511  
DATED : November 5, 2024  
INVENTOR(S) : Scott D. Brandenburg Page 1 of 1

It is certified that error appears in the above-identified patent and that said Letters Patent is hereby corrected as shown below:

On the Title Page

Item (65) Prior Publication Data, Line 2    After "Aug. 4, 2022" insert --¶(30) Foreign Application Priority Data ¶ Feb. 1, 2021 (IN) 202141004260--

Signed and Sealed this  
Twenty-second Day of April, 2025

Coke Morgan Stewart  
*Acting Director of the United States Patent and Trademark Office*